US010821666B2

(12) United States Patent
Hofmann et al.

(10) Patent No.: US 10,821,666 B2
(45) Date of Patent: Nov. 3, 2020

(54) SYSTEM FOR ADDITIVE PRODUCTION OF THREE-DIMENSIONAL OBJECTS

(71) Applicant: CL SCHUTZRECHTSVERWALTUNGS GMBH, Lichtenfels (DE)

(72) Inventors: Alexander Hofmann, Weismain (DE); Jens Stammberger, Rödental (DE); Patrick Brückner, Lautertal (DE)

(73) Assignee: Concept Laser GmbH, Lichtenfels (DE)

( * ) Notice: Subject to any disclaimer, the term of this patent is extended or adjusted under 35 U.S.C. 154(b) by 440 days.

(21) Appl. No.: 15/847,288

(22) Filed: Dec. 19, 2017

(65) Prior Publication Data
US 2018/0169944 A1    Jun. 21, 2018

(30) Foreign Application Priority Data
Dec. 19, 2016 (DE) .................. 10 2016 124 876

(51) Int. Cl.
 *B29C 64/245* (2017.01)
 *B33Y 40/00* (2020.01)
 (Continued)

(52) U.S. Cl.
 CPC .......... *B29C 64/245* (2017.08); *B29C 64/255* (2017.08); *B33Y 30/00* (2014.12);
 (Continued)

(58) Field of Classification Search
 CPC ................................................ H01L 21/67775
 (Continued)

(56) References Cited

U.S. PATENT DOCUMENTS

| 7,357,629 B2 | 4/2008 | Weiskopf et al. |
| 7,585,450 B2 | 9/2009 | Wahlstrom et al. |

(Continued)

FOREIGN PATENT DOCUMENTS

| CN | 1939705 B | 9/2011 |
| DE | 1186481 A | 2/1965 |

(Continued)

OTHER PUBLICATIONS

German Search Report Corresponding to Application No. 102016124876 dated Jan. 21, 2019.

(Continued)

*Primary Examiner* — Timothy Kennedy
(74) *Attorney, Agent, or Firm* — Dority & Manning, P.A.

(57) ABSTRACT

A system for additive production of three-dimensional objects, comprising at least one work station, which is designed to carry out at least one work process as part of the additive production of three-dimensional objects, comprising: at least one, particularly user-side, movable, particularly sliding, transport carriage, which comprises a frame structure, which comprises a receiving device, which comprises a receptacle chamber designed to receive a powder module within the frame structure, wherein the frame structure comprises at least two frame structure sections, wherein a first frame structure section is borne so as to be movable relative to a second frame structure section, particularly in a vertically aligned movement direction, wherein the transport carriage comprises at least one, particularly motorized lifting device, which is designed to generate a lifting force that moves the first frame structure section relative to the second frame structure section.

18 Claims, 3 Drawing Sheets

Figure 1:
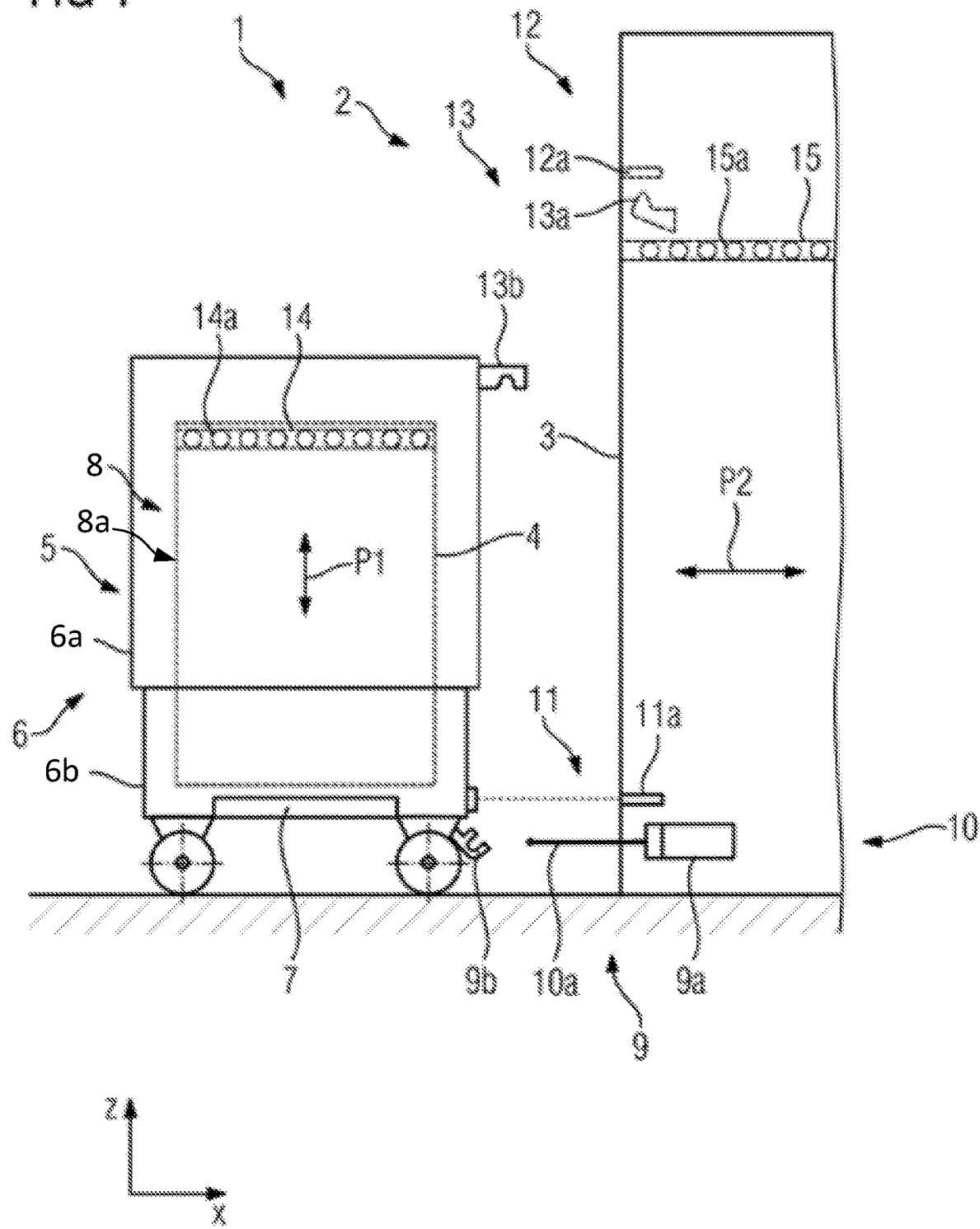

(51) Int. Cl.
  *H01L 21/677* (2006.01)
  *B33Y 30/00* (2015.01)
  *B29C 64/255* (2017.01)
  *B22F 3/105* (2006.01)

(52) U.S. Cl.
  CPC ........ *B33Y 40/00* (2014.12); *H01L 21/67775* (2013.01); *B22F 2003/1056* (2013.01); *Y02P 10/25* (2015.11)

(58) Field of Classification Search
  USPC .................................................. 414/396, 401
  See application file for complete search history.

(56) References Cited

U.S. PATENT DOCUMENTS

| | | |
|---|---|---|
| 9,120,622 B1 | 9/2015 | Elazary et al. |
| 2002/0025244 A1 | 2/2002 | Kim |

FOREIGN PATENT DOCUMENTS

| | | |
|---|---|---|
| DE | 7106135 U | 5/1971 |
| DE | 292646 A5 | 8/1991 |
| DE | 102006013489 A1 | 11/2006 |
| DE | 102009036502 A1 | 4/2010 |
| DE | 202015105184 U1 | 4/2016 |
| EP | 301231 A1 | 2/1989 |
| EP | 1769902 A2 | 4/2007 |
| GB | 2362373 A | 11/2001 |
| JP | 2001354302 A | 12/2001 |
| JP | 2006289973 A | 10/2006 |
| WO | 2007025199 A2 | 3/2007 |
| WO | WO-2015051915 A1 * | 4/2015 ....... H01L 21/67775 |

OTHER PUBLICATIONS

European Search Report Corresponding to Application No. 17179845 dated Dec. 22, 2017.

* cited by examiner

SYSTEM FOR ADDITIVE PRODUCTION OF THREE-DIMENSIONAL OBJECTS

The invention relates to a system for additive production of three-dimensional objects, comprising at least one work station, which is designed to carry out at least one work process as part of the additive production of three-dimensional objects.

Systems for additive production of three-dimensional objects are generally known. Corresponding systems typically comprise one or more work stations, which are each designed to carry out at least one work process as part of the additive production of three-dimensional objects.

Conveying powder modules, such as construction modules, which delimit a construction chamber in which the actual additive construction of three-dimensional objects occurs, between different work stations of a system is known. To convey corresponding powder modules, transport carriages have been proposed, which have a receptacle option for receiving a powder module that is to be conveyed.

In order to transfer powder modules that are accommodated in corresponding receptacle options on the transport carriage side from a corresponding powder module to or into a corresponding work station, or the reverse, the transport carriages are docked to respective housing structures on the work station side. The docking processes of transport carriages to housing structures on the work station side have sometimes been cumbersome.

Moreover, the handling of the transport carriage, particularly in a state "loaded" by a powder module, is sometimes worthy of improvement, due to a relatively high center of gravity of the transport carriage while in a state "loaded" by a powder module, compared to the "unloaded" state thereof.

The problem to be solved by the invention is that of describing an improved system for additive production of three-dimensional objects, which is particularly characterized by improved transport carriages.

Said problem is solved by a system according to claim 1. The claims dependent on claim 1 relate to possible embodiments of the system.

The system described herein ("system") serves for the additive production of three-dimensional objects; that is, technical components or technical component groups, for example. The system comprises one or more work stations, which are each designed to carry out at least one work process as part of the additive production of three-dimensional objects ("objects"). Corresponding work processes as part of the additive production of an object relate, on the one hand, to additive work processes, that is, additive construction processes in which an additive construction of an object occurs, particularly by successive, layered, selective exposure and accompanying successive, layered, selective solidification of construction material layers of a construction material that can be solidified by means of an energy beam, and preparatory work processes carried out or to be carried out before respective additive work or construction processes, that is, for example, cleaning, inertization and temperature control processes of powder modules, and subsequent work processes carried out or to be carried out after respective additive work or construction processes, that is, for example, unpacking processes of additively produced objects from corresponding powder modules.

A first work station, designed to carry out additive work processes, also designated as a process station, can be designed as a device for additive production of objects ("device"), or can comprise such a device. A corresponding device is designed for the additive production of objects, that is, for example, technical components or technical component groups, by successive, layered, selective exposure and accompanying successive, layered, selective solidification of construction material layers of a construction material that can be solidified. The construction material can be a particulate or powdery metal, plastic and/or ceramic material. The selective solidification of construction respective material layers to be solidified occurs on the basis of object-based construction data. Corresponding construction data describe the geometric design of the respective object to be additively produced and can, for example, include "sliced" CAD data of the object to be additively produced. The device can be designed as an SLM device, for example, that is, as a device for carrying out selective laser melting processes (SLM process), or as an SLS device, that is, as a device for carrying out selective laser sintering processes (SLS process).

A corresponding device comprises the functional components typically required for carrying out additive construction processes. These particularly include a coating device, which is designed to form construction material layers to be selectively solidified (in the construction plane of the device), and an exposure device, which is designed to selectively expose construction material layers to be selectively solidified (in the construction plane of the device). The coating device typically comprises a plurality of components, that is, for example, a coating element comprising a coating tool, which is particularly blade-shaped, and a guide device for guiding the coating element along a defined movement track. The exposure device also typically comprises a plurality of components, that is, for example, a beam generating device for generating an energy or laser beam, a beam deflection device (scanner device) for deflecting an energy or laser beam generated by the beam generating device to a region of a construction material layer to be selectively solidified that is to be exposed, and various optical elements, such as lens elements, lens assembly elements, etc. The indicated functional components of the device are typically arranged or designed on or in a process chamber of the device, which can typically be inertized.

An optional additional (or second) work station, designed to carry out subsequent work processes, also designated as a subsequent processing station, can be designed as a device for unpacking an additively produced object, or can comprise such a device. The device can be designed to unpack an additively produced object by removing the construction material enclosing the additively produced objects that is typically not solidified. A corresponding device comprises the functional components required to remove the construction material enclosing the additively produced objects that is typically not solidified. These particularly include a suction and/or blowing device, which is designed to generate a suction and/or a blowing current, by means of which the construction material to be removed can be suctioned or blown away.

An optional additional (or third) work station, designed to carry out preparatory work processes, also designated as a preparatory station, can be designed as a device for cleaning and/or inertizing and/or temperature-controlling powder modules, or can comprise such a device. The device can be designed to clean and/or inertize and/or temperature-control powder modules. A corresponding device comprises the functional components required to clean and/or inertize and/or temperature-control powder modules. These particularly include a cleaning device, which is designed to generate a cleaning flow that cleans a powder chamber comprised on the powder module side, for example, and an inertization device, which is designed to generate an inert gas flow that inertizes a powder chamber comprised on the powder module side, and a temperature control device, which is designed to regulate the temperature of a powder module to a certain target temperature.

Irrespective of their specific functional design, the respective work stations typically comprise a separate housing structure, on or in which the functional components of the respective work station are arranged or designed. The work stations are thus considered separate functional units of the system, spatially-physically defined by respective housing structures, which are positionable in various configurations relative to each other, such as in one or more buildings (building sections), particularly factory halls.

The system typically comprises a plurality of powder modules used during the additive production of three-dimensional objects. A respective powder module is designed to receive and/or dispense construction material and typically comprises a powder chamber for said purpose. The powder chamber adjoins a powder chamber that can be filled with construction material. The powder chamber is delimited at least laterally by walls (powder chamber walls) of the normally hollow cuboid or holly cylindrical powder chamber. The powder chamber can be delimited by a carrier device on the floor side. A corresponding carrier device is typically borne movably between two end positions, that is, between an upper (relative to the height of the powder module) and a lower end position, relative to the powder chamber. The movable bearing of the carrier device enables the implementation of a movement, particularly a linear movement of the carrier device along a vertical movement axis or in a vertical movement direction. The movable bearing of the carrier device is typically implemented by a drive and/or actuator device, particularly an (electro)motorized drive and/or actuator device, coupled thereto.

Specifically, a powder module can be a construction module in which the actual additive construction of objects occurs and which is filled successively in layers with construction material to be selectively solidified while carrying out the additive construction processes, or a dosing module via which construction material is dosed into the process chamber during the additive construction processes, or a catch or overflow module that is filled with construction material that is not to be solidified while carrying out the additive construction processes.

The system furthermore comprises at least one transport carriage—although one transport carriage is mostly referred to in the following, the system typically comprises a plurality of corresponding transport carriages. The transport carriage can be moved or traveled by the user, that is, by active movement by a user, and/or (partially) automated via an integrated, particularly (electro)motorized drive device between different work stations of the system. Insofar as it is present on the transport carriage side, a corresponding drive device typically comprises at least one force transmission device, which is designed to transmit a drive force generated by the drive device to a subsurface. The force transmission device can comprise, for example, a number of wheels, rollers, chains, etc., via which a transmission of the drive force generated by the drive device to a subsurface can be implemented.

The transport carriage comprises a frame structure. The frame structure comprises at least two frame structure sections. A first frame structure section is borne so as to be movable relative to a second frame structure section, particularly in a vertically aligned movement direction. Although it is generally conceivable, the second frame structure section is typically not movably borne. The first frame structure section is typically arranged or designed above the second frame structure section. In order to implement movements of the first frame structure section relative to the second frame structure section, the transport carriage comprises at least one, particularly (electro)motorized lifting device. The lifting device is designed to generate a lifting force that moves the first frame structure section in a movement, that is, a lifting or lowering movement, relative to the second frame structure section.

The frame structure comprises a receiving device. The receiving device comprises a receptacle chamber or a receptacle volume. The receptacle chamber is designed to receive at least one powder module within the frame structure. The dimensions of the receptacle chamber are selected so that the receptacle chamber is designed to (completely) receive at least one powder module. The receiving device, that is, particularly the receptacle chamber, is typically arranged or designed in the first frame structure section.

The lifting device is particularly designed to move the first frame structure section at least between a transport position, in which a transfer of a powder module from the transport carriage into a work station, or the reverse, is impossible, and a transfer position, in which a transfer of a powder module from the transport carriage into a work station is possible. The transport or transfer position is typically certain vertical positions of the first frame structure section relative to the second frame structure section. The transfer position typically represents an upper position of the frame structure section, particularly in comparison to the transport position. The transport position typically represents a lower position of the first frame structure section, particularly in comparison to the transfer position. The movable bearing of the first frame structure section relative to the second frame structure section enables the implementation of different (vertical) positions of the first frame structure section, which is typically accompanied by a shift in the center of gravity of the transport carriage, which has positive effects on the movement or travel characteristics of the transport carriage. The possible risk of the transport carriage tipping is eliminated or reduced by the comparatively low center of gravity in the transport position.

The transport carriage is movable into a pre-docking position. In the pre-docking position, the transport carriage is arranged at a certain distance, that is, particularly at a distance in a range between 5 and 15 cm, spaced apart from a housing structure on the work station side. The pre-docking position can be considered a preliminary stage for a later docking position, in which the transport carriage actually docks to a housing structure on the work station side; in the pre-docking position, a transfer of a powder module from a transport carriage into a work station, or the reverse, is typically impossible or not provided for.

The system can comprise a first securing device. The first securing device is designed to secure a transport carriage, which is moved into the pre-docking position, in the pre-docking position. The first securing device is thus designed to secure the position of a transport carriage, which is moved into the pre-docking position, relative to the housing structure on the work station side.

The first securing device can comprise at least one first securing element on the work station side and at least one corresponding counterpart securing element on the transport carriage side. The first securing element on the work station side, that is, arranged or designed on the work station side, is designed to interact with a counterpart securing element on the transport carriage side, that is, arranged or designed on the transport carriage, such that the position of the transport carriage that is moved into the pre-docking position is secured relative to the housing structure on the work station side, and thus the transport carriage cannot be moved out of the pre-docking position. The securing element on the work station side and the counterpart securing element on the transport carriage side can interlockingly interact in the securing position. The securing element on the work station side can consequently be designed as or comprise a form fitting element, that is, for example, as a particularly hook-like or hook-shaped protrusion. The counterpart securing element on the transport carriage side can consequently be designed as or comprise a corresponding counterpart form fitting element, that is, for example, as a particularly groove-like or groove-shaped receptacle for the protrusion.

The securing element on the work station side can be movably borne between a securing position, in which it is moved relative to a counterpart securing element on the transport carriage side, such that it interacts therewith, forming a securing of the pre-docking position of the transport carriage, and a non-securing position, in which it is moved relative to a counterpart securing element on the transport carriage side, such that it does not interact therewith, forming a securing of the docking position of the transport carriage. The movable bearing of the securing element can be implemented by a setting device. The setting device can comprise at least one setting element (movement-)coupled to the securing element. The setting device can be designed as or comprise, for example, a piston-cylinder device comprising a movably borne set piston.

Alternatively or in addition, a counterpart securing element on the transport carriage side can (also) be movably borne between a securing position, in which it is moved relative to a securing element on the work station side, such that it interacts therewith, forming a securing of the pre-docking position of the transport carriage, and a non-securing position, in which it is moved relative to a securing element on the work station side, such that it does not interact therewith, forming a securing of the docking position of the transport carriage. The movable bearing of the counterpart securing element can also be implemented by a setting device. The setting device can comprise at least one setting element (movement-) coupled to the counterpart securing element. The setting device can be designed as or comprise a swivel device that is designed to swivel the counterpart securing element between the securing and the non-securing position, for example.

The system can comprise a first detection device. The first detection device is designed to detect a transport carriage that is moved into the pre-docking position and to generate pre-docking position information describing a transport carriage that is moved into the pre-docking position. Alternatively, or in addition, the first detection device is designed to detect a securing of a transport carriage that is moved into the pre-docking position by means of the first securing device and to generate first securing information describing a securing of a transport carriage that is moved into the pre-docking position, implemented by means of the first securing device. The first detection device can comprise at least one acoustic, electric, optical or haptic detection element, for example, which can draw conclusions about the positioning and/or securing of a transport carriage in the pre-docking position on the basis of acoustic, electric, optical or haptic signals, for example. Specific examples of a detection element are a barrier (acoustic or optical) or a contact (electric and/or mechanical). The respective detection elements can be arranged or designed on the work station side and/or the transport carriage side. Irrespective of the specific embodiment thereof, the first detection device can detect whether a transport carriage has been moved into the pre-docking position and/or whether a transport carriage moved into the pre-docking position is secured in the pre-docking position. The respective detection result is depicted via the pre-docking position information or via the securing information.

The lifting device on the transport carriage side can be designed to generate a lifting force that moves the first frame structure section, particularly proceeding from the transport position, relative to the second frame structure section, on the basis of pre-docking position information and/or on the basis of securing information. In particular, the lifting device, particularly proceeding from the transport position, can be designed to move the first frame structure section in the direction of an additional pre-transfer position, described below, or in the direction of the transfer position if a transport carriage is moved into the pre-docking position and/or if a transport carriage that is moved into the pre-docking position is secured in the pre-docking position. The safety of the system in particular can be thereby improved.

The transport carriage can comprise a lifting release device associated with the lifting device on the transport carriage side. The lifting release device is designed to generate release information on the basis of a release command generated on the user side via a user interface, which is particularly on the transport carriage side, such as via a haptic input. The lifting release device can accordingly comprise an actuating interface that can be actuated on the user side, such as a button, knob, touch screen, etc. The lifting device can be designed to generate the lifting force that moves the first frame structure section relative to the second frame structure section on the basis of release information generated by the lifting release device. Consequently, a user release can be required before an actual movement of the first frame structure section occurs. The safety of the system can be thereby further improved.

It was mentioned that the lifting device on the transport carriage side is particularly designed to move the first frame structure section between a transport position and a transfer position. The lifting device can furthermore be designed to move the first frame structure section, particularly proceeding from the transport position of the first frame structure section and the pre-docking position of the transport carriage, to a pre-transfer position located above the transfer position. The pre-transfer position can be located several cm, that is, between 5 and 15 cm, for example, above the transfer position (in the vertical direction). The pre-transfer position can be considered a preliminary stage for a transfer position, in which, as mentioned, a transfer of a powder module from the transport carriage into the work station, or the reverse, is possible; in the pre-transfer position, a transfer of a powder module from a transport carriage into a work station, or the reverse, is typically impossible or not provided for.

The system can comprise a second detection device. The second detection device is designed to detect a first frame structure section that is moved into the pre-transfer position and to generate pre-transfer position information describing a frame structure section that is moved into the pre-transfer position. The second detection device can comprise at least one acoustic, electric, optical or haptic detection element, for example, which can draw conclusions about the positioning of a first frame structure section in the pre-transfer position on the basis of acoustic, electric, optical or haptic signals, for example. Specific examples of a detection element are, again, a barrier (acoustic or optical) or a contact (electric and/or mechanical). The respective detection elements can in turn be arranged or designed on the work station side and/or the transport carriage side. Irrespective of the specific embodiment thereof, the second detection device can detect whether a first frame structure section has been moved into the pre-transfer position. The respective detection result is depicted via the pre-transfer position information.

It was mentioned that the transport carriage is also movable into a docking position, particularly proceeding from the pre-docking position. The pre-docking and docking position are typically specific horizontal (lateral) positions of the transport carriage relative to a housing structure on the work station side. In the docking position, the transport carriage is arranged at a smaller distance compared to the pre-docking position from a respective housing structure on the work station side or directly contacting a respective housing structure on the work station side. In the docking position, the transport carriage is docked to the housing structure on the work station side such that a transfer of a powder module from the transport carriage into the work station, or the reverse, is possible. In the docking position, a transfer of a powder module from a transport carriage into a work station, or the reverse, is thus possible or provided for.

Movements of the transport carriage from the pre-docking position into the docking position self-evidently assume a releasing of any securing of the transport carriage in the pre-docking position implemented by the first securing device. A movement of the transport carriage into the docking position can, in principle, be carried out manually or (semi) automatically. In the latter case, the first securing device can be used, for example, to move the transport carriage proceeding from the pre-docking position to the docking position. This can be implemented in that a force, typically a traction force, moving the transport carriage from the pre-docking position into the docking position is generated by the interaction and a movement of the securing elements on the work station side and the counterpart securing elements on the transport carriage side relative to each other. The force can be specifically implemented by a movement of the securing element on the work station side that interacts, that is, particularly is coupled, with the counterpart securing element on the transport carriage side, which moves the transport carriage in to the docking position.

The lifting device on the transport carriage side can be designed to move (lower) the first frame structure section, particularly proceeding from the pre-transfer position, into the transfer position on the basis of pre-transfer position information. In particular, the lifting device can be designed to move the first frame structure section toward the transfer position if the transport carriage is moved into the docking position, particularly proceeding from the pre-transfer position. The safety of the system in particular can be thereby again improved.

The system can comprise a second securing device. The second securing device is designed to secure a first frame structure section of a transport carriage, which is moved into the transfer position, in the transfer position. The second securing device is thus designed to secure the position of a first frame structure section, which is moved into the transfer position, particularly relative to the housing structure on the work station side.

The second securing device can comprise at least one first securing element on the work station side and at least one corresponding counterpart securing element on the transport carriage side. The first securing element on the work station side, that is, arranged or designed on the work station, is designed to interact with a counterpart securing element on the transport carriage side, that is, arranged or designed on the transport carriage, such that the position of the first frame structure section that is moved into the transfer position is secured relative to the housing structure on the work station side, and thus the first frame structure section (without actuation of the lifting device) cannot be moved out of the transfer position.

The securing element on the work station side and the counterpart securing element on the transport carriage side can interlockingly interact in the transfer position. The securing element on the work station side can consequently be designed as or comprise a form fitting element, that is, for example, as a particularly conical or cone-like or cone-shaped protrusion. The counterpart securing element on the transport carriage side can consequently be designed as or comprise a corresponding counterpart form fitting element, that is, for example, as a particularly conical or cone-like or cone-shaped receptacle or bushing. A corresponding form-fitting element, particularly in the form of a conical or cone-like or cone-shaped protrusion can, due to the geometric design thereof, perform a centering function, approximately like a centering bolt, for example. A centering of the first frame structure section or of the entire transport carriage relative to a housing structure on the work station side, and thus a securing of the position of the first frame structure section or the entire transport carriage can be implemented by the interaction of a form-fitting element and a counterpart form-fitting element in at least two, particularly three spatial directions that are oriented orthogonally to each other.

It was mentioned multiple times that a transfer of a powder module from the transport carriage into a work station, or the reverse, is possible in the transfer position. The frame structure on the transport carriage side can comprise at least one transfer interface for this purpose, particularly in the form of an opening, which enables a transfer of a powder module from the receiving device into a work station or a transfer of a powder module from a work station into a receiving device on the transport carriage side. Similarly, a housing structure on the work station side can comprise at least one transfer interface, particularly in the form of an opening, which enables a transfer of a powder module from a work station into a receiving device on the transport carriage side or a transfer of a powder module from a receiving device on the transport carriage side into a work station. In the transfer position of a first frame structure section of a respective transport position, the transfer interface on the transport carriage side typically aligns with a transfer interface on the work station side, and therefore a transfer of a powder module from the transport carriage into the work station, or the reverse, is enabled.

In order to enable a transfer of powder modules between the transport carriages associated with the system and the work stations associated with the system, within the system, which is simplified because it is standardized, the respective transfer interfaces on the work station side and the transport carriage side can be designed to be identical in terms of geometrical design for all of the work stations and transport carriages associated with the system, that is, standardized.

The respective transfer interfaces on the transport carriage side and on the work station side can be sealed via a closure device. The closure device can comprise a closure element that is borne so as to be movable between an open position, in which the respective transfer interface is enabled for transfer of a powder module, and a closed position, in which the respective transfer interface is not enabled for transfer of a powder module. A movement of the closure element into the open or into the closed position, or the reverse, can be automated, such as in dependence on the detection of the transfer position, that is, in dependence on the detection of a first frame structure section that is moved into the transfer position. A detection of the transfer position or the detection of a first frame structure section that is moved into the transfer position can occur via the second detection device or via a third detection device. The third detection device can be designed analogously to the second detection device, and therefore reference is made to the comments in this respect.

The receiving device on the transport carriage side can comprise a bearing device which is designed particularly for suspended bearing of at least one powder module in the receptacle chamber. The bearing device can be designed to movably bear a powder module, relative to the first frame structure section, particularly between a first position that is completely accommodated in the receptacle chamber or frame structure (powder module bearing position) and a second position that partially protrudes out of the receptacle chamber or the frame structure (powder module transfer position). For this purpose, the bearing device can comprise a plurality of bearing elements, which enable a movable bearing of a powder module accommodated in the receptacle chamber relative to the first frame structure section. The corresponding bearing elements can be sliding or roller bearing elements, which interact with a powder module, forming a movable bearing, that is, for example, by engaging in action sections on the powder module side, formed by recesses on the powder module side, for example.

A corresponding bearing device can comprise a powder module securing device. The powder module securing device is designed to secure the position of a powder module accommodated in the receptacle chamber. The powder module securing device can comprise at least one securing element on the frame structure side, which is designed to interact with a counterpart securing element on the powder module side, such that the positioning of the powder module accommodated in the receptacle chamber is secured. A corresponding securing element can be movable between a securing position, in which it is movable relative to a counterpart securing element on the powder module side, such that it interacts therewith, forming a securing of the position of a powder module, and a non-securing position, in which it is moved relative to a counterpart securing element on the powder module side, such that it does not interact therewith, forming a securing of the position of a powder module.

The securing element on the frame structure side can interact with a respective counterpart securing element on the powder module side in the transport position of the first frame structure section. The transport position thus corresponds to a securing position in which the position of a powder module is secured in respect of undesired position changes. This can be implemented in that the counterpart securing element on the powder module side in the transport position is movable relative to the securing element on the frame structure side such that they interact, forming a securing of the powder module accommodated in the receptacle chamber.

The securing element on the frame structure side and the counterpart securing element on the powder module side can interlockingly interact. The securing element can be designed as or comprise a form fitting element, that is, for example, designed as or comprise particularly a bolt-like or bolt-shaped protrusion and the counterpart securing element can be designed as or comprise a counterpart closure element, that is, for example, particularly a bushing-like or bushing-shaped receptacle for the protrusion.

In a manner analogous to that of the receptacle device on the transport carriage side, respective work stations can also comprise a corresponding bearing device. The bearing device can be designed to bear a powder module along a transport track extending through the work station, movably relative to the housing structure, for which purpose the bearing device comprises bearing elements that enable a movable bearing of a powder module arranged in the bearing device relative to the housing structure on the work station side. The corresponding bearing elements can, in turn, be sliding or roller bearing elements, for example, which interact with a powder module, forming a movable bearing, that is, for example, by engaging in action sections on the powder module side, formed by recesses on the powder module side, for example.

The respective bearing devices on the transport carriage side and the respective bearing devices on the work station side expediently align in the transfer position of a first frame structure section of a respective transport carriage so that a continuous transport track extending between the transport carriage and the work station results, which enables powder modules borne in respective bearing devices to be easily transferred from a transport carriage into a work station and the reverse. Respective bearing devices on the transport carriage side and respective bearing devices on the work station side are expediently designed to be identical or standardized for the same purpose.

In addition to the system, the invention also relates to a transport carriage for a corresponding system. The transport carriage is characterized in that it comprises a frame structure that comprises a receptacle device, which comprises a receptacle chamber designed to receive a powder module within the frame structure, wherein the frame structure comprises at least two frame structure sections, wherein a first frame structure section is movably borne relative to a second frame structure section, particularly in a vertically aligned movement direction, wherein the transport carriage comprises at least one lifting device, particularly a motorized lifting device, which is designed to generate a lifting force that moves the first frame structure section relative to the second frame structure section. All comments in connection with the system apply analogously for the transport carriage.

Figure 2:
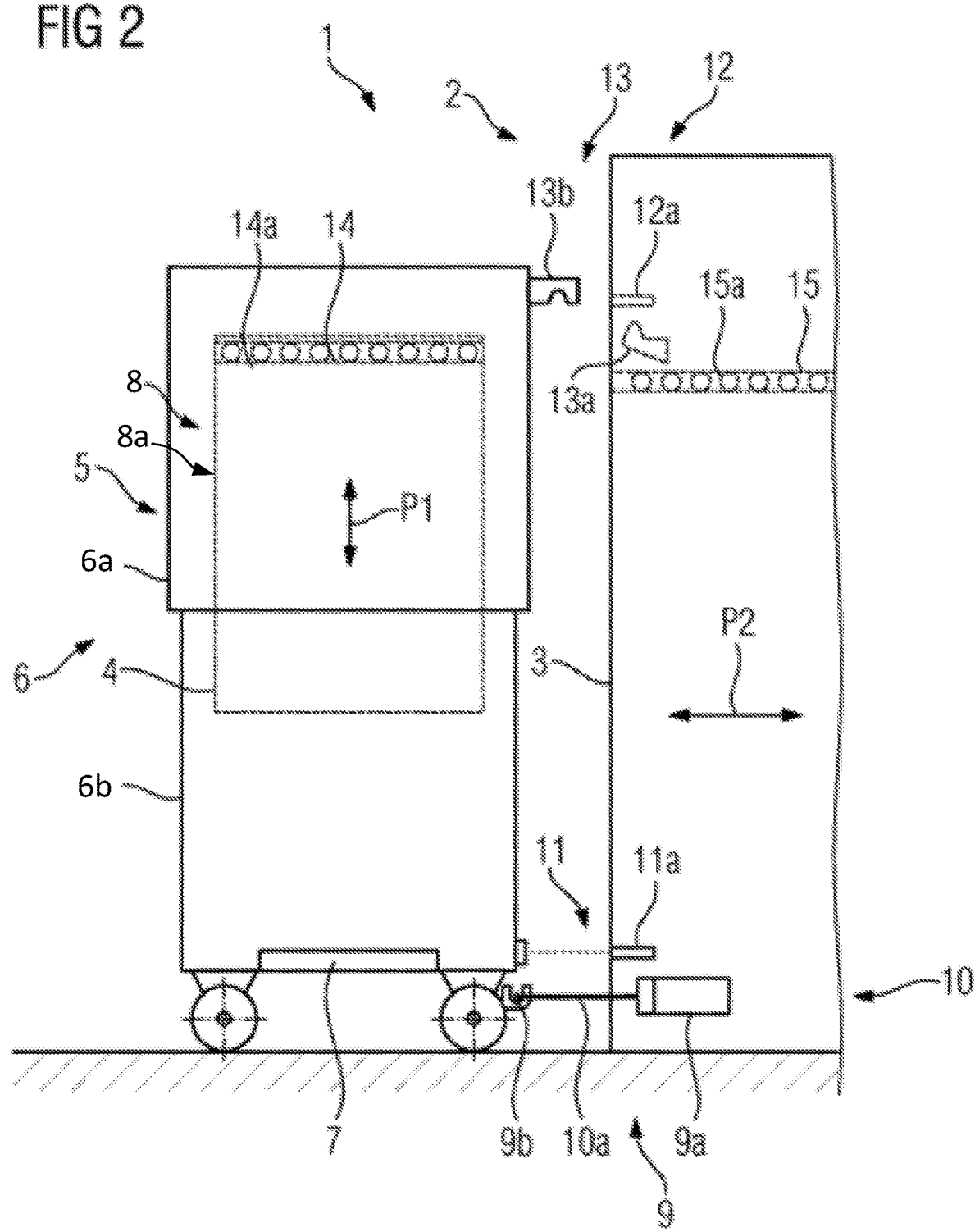
Figure 3:
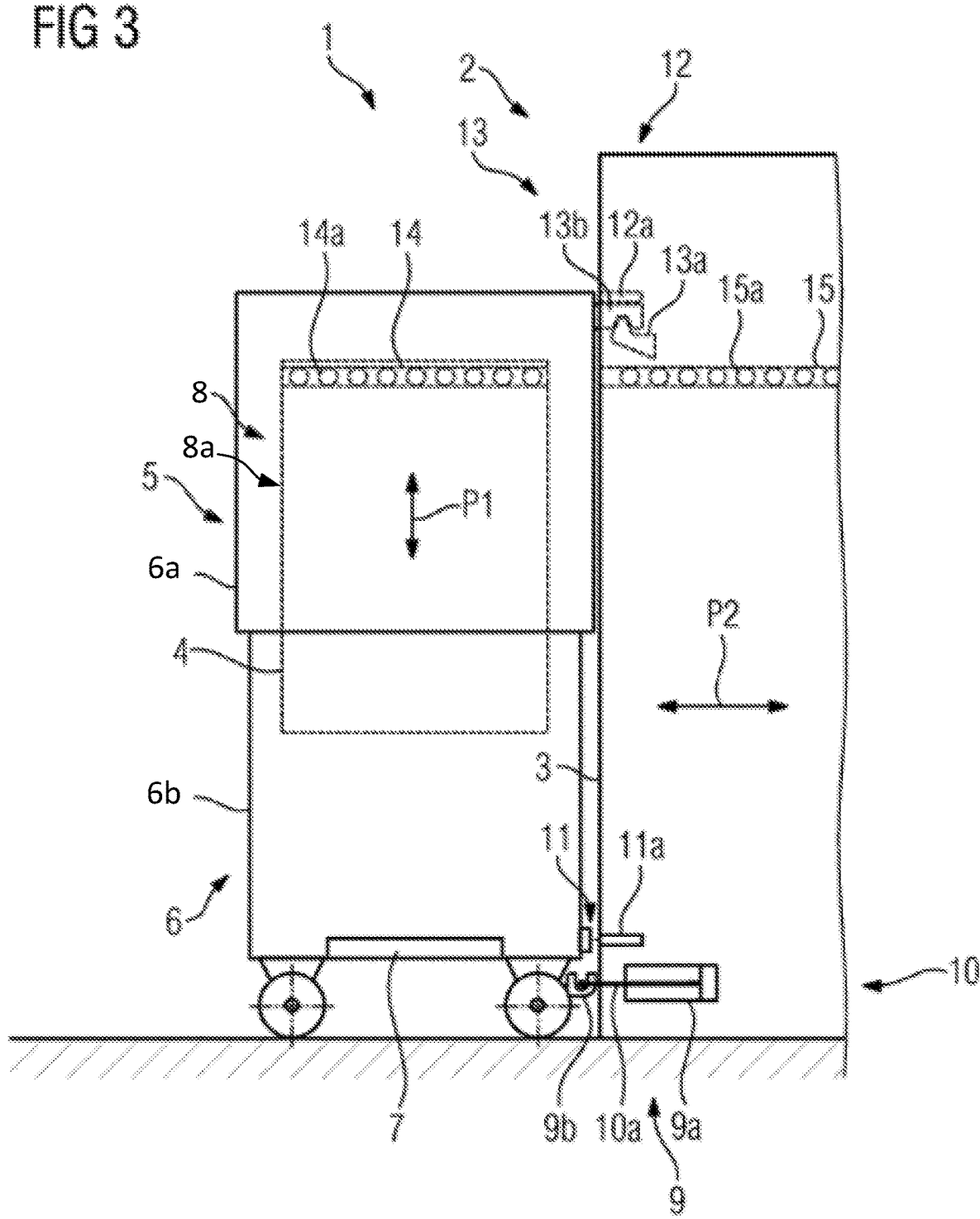

The invention is explained in more detail based on embodiments in the figures. They show:

FIGS. 1-3 each a schematic diagram of a section of a system for additive production of three-dimensional objects according to an embodiment.

FIGS. 1-3 each show a schematic diagram of a section of a system 1 for additive production of three-dimensional objects according to an embodiment.

The system 1 typically comprises a plurality of work stations 2, even though only one single work station 2 is shown in the figures, that is, for example, process stations designed to carry out additive work processes that are designed as or comprise a device (not described in greater detail) for the additive production of three-dimensional objects. A corresponding device comprises the functional components required for carrying out additive construction processes. These particularly include a coating device (not shown), which is designed to form construction material layers to be selectively solidified, and an exposure device (not shown), which is designed to selectively expose construction material layers to be selectively solidified.

Other work stations 2 can be work stations 2 designed to carry out subsequent work processes, also designated as subsequent processing stations, or work stations 2 designed to carry out preparatory work processes, also designated as preparatory stations.

Irrespective of their specific functional design, the respective work stations 2 comprise a separate housing structure 3, on or in which the functional components of the respective work station 2 are arranged or designed. The work stations 2 are considered separate functional units of the system 1, spatially-physically defined by respective housing structures 3, which are positionable in various configurations relative to each other, such as in one or more buildings (building sections), particularly factory halls.

The system 1 comprises a plurality of powder modules 4 used during the additive production of three-dimensional objects. A respective powder module 4 is designed to receive and/or dispense construction material and typically comprises a powder chamber for said purpose (not shown). The powder chamber adjoins a powder chamber that can be filled with construction material. The powder chamber is delimited at least laterally by walls (powder chamber walls) of the powder chamber. The powder chamber can be delimited by a carrier device (not shown) on the floor side. The carrier device can be borne movably between two end positions, that is, between an upper (relative to the height of the powder module 4) and a lower end position, relative to the powder chamber. The movable bearing of the carrier device enables the implementation of a movement, particularly a linear movement of the carrier device along a vertical movement axis or in a vertical movement direction. The movable bearing of the carrier device can be implemented by a drive and/or actuator device, particularly an (electro) motorized drive and/or actuator device, coupled thereto.

Specifically, a powder module 4 can be a construction module, a dosing module or a catch or overflow module.

The system 1 furthermore comprises a plurality of transport carriages 5. A transport carriage 5 can be moved or traveled by the user, that is, by active movement by a user, and/or (partially) automated via an integrated, particularly (electro)motorized drive device (not shown) between the work stations 2 of the system 1.

The transport carriage 5 comprises a frame structure 6. The frame structure 6 comprises two frame structure sections, 6 *a* and 6 *b*. A first frame structure section 6 *a* is borne so as to be movable relative to a second frame structure section 6 *b*, particularly in a vertically aligned movement axis or direction, indicated by the double arrow P1. The first frame structure section 6 *a* is visibly arranged above the second frame structure section 6 *b*. In order to implement movements of the first frame structure section 6 *a* relative to the second frame structure section 6 *b*, the transport carriage 5 comprises a lifting device 7, which is particularly (electro) motorized and purely schematically indicated. The lifting device 7 is designed to generate a lifting force that moves the first frame structure section 6 *a* in a movement, that is, a lifting or lowering movement, relative to the second frame structure section 6 *b*.

The frame structure 6 comprises a receiving device 8 arranged in the first frame structure section 6*a*. The receiving device 8 comprises a receptacle chamber 8*a*, which is designed to receive at least one powder module 4 within the frame structure 6. The dimensions of the receptacle chamber 8*a* are selected so that the receptacle chamber 8*a* is designed to (completely) receive at least one powder module 4.

The lifting device 7 is designed to move the first frame structure section 6*a* at least between a transport position shown in FIG. 1, in which a transfer of a powder module 4 from the transport carriage 5 into a work station 2, or the reverse, is impossible, and a transfer position shown in FIG. 3, in which a transfer of a powder module 4 from the transport carriage 5 into a work station 2 is possible. The transfer position represents an upper position of the first frame structure section 6*a*, particularly in comparison to the transport position. The transport position typically represents a lower position of the first frame structure section 6*a* relative to the second frame structure section 6*b*, particularly in comparison to the transfer position. The transport or transfer position is certain vertical positions of the first frame structure section 6*a*.

The transport carriage 5 is movable into a pre-docking position shown in FIG. 2. In the pre-docking position, the transport carriage 5 is arranged at a certain distance, that is, particularly at a distance in a range between 5 and 15 cm, spaced apart from a housing structure 3 on the work station side. The pre-docking position can be considered a preliminary stage for a later docking position, in which the transport carriage 5 docks to a housing structure 3 on the work station side; in the pre-docking position, a transfer of a powder module 4 from the transport carriage 5 into the work station 2, or the reverse, is impossible or not provided for.

The system 1 comprises a first securing device 9, which is designed to secure a transport carriage 5, which is moved into the pre-docking position, in the pre-docking position. The first securing device 9 comprises at least one first securing element 9*a* on the work station side and at least one corresponding counterpart securing element 9*b* on the transport carriage side. A first securing element 9*a* on the work station side, that is, arranged or designed on the work station 2, is designed to interact with a counterpart securing element 9*b* on the transport carriage side, that is, arranged or designed on the transport carriage 5, such that the position of the transport carriage 5 that is moved into the pre-docking position is secured relative to the housing structure 3 on the work station side. The securing element 9*a* on the work station side and the counterpart securing element 9*b* on the transport carriage side interlockingly interact in the securing position. The securing element 9*a* on the work station side is designed as a form fitting element, that is, for example, designed particularly as a hook-like or hook-shaped protrusion and the counterpart securing element 9*b* is designed as a counterpart closure element, that is, for example, particularly a groove-like or groove-shaped receptacle for the protrusion.

Based on a comparison of FIGS. 1-3, it is clear that the securing element 9*a* on the work station side can be movably borne between a securing position shown in FIG. 2, in which it is moved relative to a counterpart securing element 9*b* on the transport carriage side, such that it interacts therewith, forming a securing of the pre-docking position of the transport carriage 5, and a non-securing position shown in FIG. 1, in which it is moved relative to a counterpart securing element 9*b* on the transport carriage side, such that it does not interact therewith, forming a securing of the docking position of the transport carriage 5. The movable bearing of the securing element 9*a* is implemented by a setting device 10, which comprises a setting element 10*a* (movement-)coupled to the securing element 9*a*. The setting device 10 is designed in the embodiments shown in the figures as a piston-cylinder device comprising a movably borne setting piston.

The counterpart securing element 9*a* on the transport carriage side can be movably borne between a securing position shown in FIG. 2, in which it is moved relative to the securing element 9b on the work station side, such that it interacts therewith, forming a securing of the pre-docking position of the transport carriage 5, and a non-securing position shown in FIG. 1, in which it is moved relative to the securing element 9a on the work station side, such that it does not interact therewith, forming a securing of the docking position of the transport carriage 5. The movable bearing of the counterpart securing element 9b is implemented by a setting device (not shown in more detail), which comprises a setting element (movement-)coupled to the counterpart securing element 9b. The setting device is designed in the embodiments shown in the figures as a swivel device that is designed to swivel the counterpart securing element 9b between the securing and the non-securing position, for example.

The system 1 comprises a first detection device 11, which is designed to detect a transport carriage 5 that is moved into the pre-docking position and to generate pre-docking position information describing a transport carriage 5 that is moved into the pre-docking position, and/or which is designed to detect a securing of a transport carriage 5 that is moved into the pre-docking position, implemented by means of the first securing device 9, and to generate securing information describing a securing of a transport carriage 5 that is moved into the pre-docking position, implemented by means of the first securing device 9. The first detection device 11 can comprise at least one acoustic, electric, optical or haptic detection element 11a, for example, which can draw conclusions about the positioning and/or securing of a transport carriage 5 in the pre-docking position on the basis of acoustic, electric, optical or haptic signals, for example. Specifically, the detection element 11a can be designed, for example, as a barrier (acoustic or optical) or a contact (electric and/or mechanical). Corresponding detection elements 11a can be arranged or designed on the work station side and/or the transport carriage side.

The lifting device 7 on the transport carriage side can be designed to generate a lifting force that moves the first frame structure section 6 a, particularly proceeding from the transport position, relative to the second frame structure section 6 b, on the basis of pre-docking position information and/or on the basis of securing information. In particular, the lifting device, particularly proceeding from the transport position, is designed to move the first frame structure section 6 a in the direction of the transfer position if a transport carriage 5 is moved into the pre-docking position and/or if a transport carriage 5 that is moved into the pre-docking position is secured in the pre-docking position.

The transport carriage 5 can comprise a lifting release device (not shown) associated with the lifting device 7 on the transport carriage side. The lifting release device is designed to generate release information on the basis of a release command generated on the user side via a user interface (not shown), which is particularly on the transport carriage side, such as via a haptic input. The lifting release device can accordingly comprise an actuating interface that can be actuated on the user side, such as a button, knob, touch screen, etc. The lifting device 7 can be designed to generate the lifting force that moves the first frame structure section 6a relative to the second frame structure 6b section on the basis of release information generated by the lifting release device. Consequently, a user release can be required before an actual movement of the first frame structure section 6a occurs.

As shown in FIG. 2, the lifting device 7 is furthermore designed to move the first frame structure section 6a, particularly proceeding from the transport position of the first frame structure section 6a and the pre-docking position of the transport carriage 5, to a pre-transfer position shown in FIG. 2 located above the transfer position shown in FIG. 3. The pre-transfer position is located several cm, that is, between 5 and 15 cm, for example, above the transfer position (in the vertical direction). The pre-transfer position can be considered a preliminary stage for a transfer position, in which, as mentioned, a transfer of a powder module 4 from the transport carriage 5 into the work station 2, or the reverse, is possible; in the pre-transfer position, a transfer of a powder module 4 from the transport carriage 5 into a work station 2, or the reverse, is typically impossible or not provided for.

The system 1 furthermore comprises a second detection device 12, which is designed to detect a first frame structure section 6a that is moved into the pre-transfer position and to generate pre-transfer position information describing a first frame structure section 6a that is moved into the pre-transfer position. The second detection device 12 comprises at least one acoustic, electric, optical or haptic detection element 12a, for example, which can draw conclusions about the positioning of a first frame structure section 6a in the pre-transfer position on the basis of acoustic, electric, optical or haptic signals, for example. Specifically, the detection element 12a can in turn be designed, for example, as a barrier (acoustic or optical) or a contact (electric and/or mechanical). Corresponding detection elements 12a can in turn be arranged or designed on the work station side and/or the transport carriage side.

The figure shows that the pre-docking position (FIG. 2) and docking position (FIG. 3) are specific horizontal (lateral) positions of the transport carriage 5 relative to a housing structure 3 on the work station side. A comparison of FIGS. 2 and 3 show that the transport carriage 5 is arranged spaced apart, at a smaller distance compared to the pre-docking position, from the housing structure 3 on the work station side or directly contacting the housing structure 3 on the work station side. In the docking position, the transport carriage 5 is docked to the housing structure 3 on the work station side such that a transfer of a powder module 4 from the transport carriage 5 into the work station 2, or the reverse, is possible.

Movements of the transport carriage 5 from the pre-docking position into the docking position self-evidently assume a releasing of any securing of the transport carriage 5 in the pre-docking position implemented by the first securing device 9. A movement of the transport carriage 5 into the docking position can, 5 in principle, be carried out manually or (semi) automatically. In the latter case, the first securing device 9 can be used, for example, to move the transport carriage 5 proceeding from the pre-docking position to the docking position. This can be implemented in that a force, typically a traction force, moving the transport carriage 5 into the docking position is generated by the interaction and a movement of the securing elements 9a on the work station side and the counterpart securing elements 9b on the transport carriage side relative to each other. The force can be specifically implemented by a movement of the securing element 9a on the work station side that interacts, that is, particularly is coupled, with the counterpart securing element 9b on the transport carriage side, which moves the transport carriage 5 in to the docking position.

The lifting device 7 on the transport carriage side is designed to move (lower) the first frame structure section 6a, particularly proceeding from the pre-transfer position, into the transfer position on the basis of pre-transfer position information. In particular, the lifting device 7 can be designed to move the first frame structure section 6a toward the transfer position if the transport carriage 5 is moved into the docking position, particularly proceeding from the pre-transfer position.

The system 1 furthermore comprises a second securing device 13, which is designed to secure the first frame structure section 6 a, which is moved into the transfer position, in the transfer position. The second securing device 13 comprises at least one first securing element 13 a on the work station side and at least one corresponding counterpart securing element 13 b on the transport carriage side. A respective first securing element 13 a on the work station side, that is, arranged or designed on the work station 2, is designed to interact with a respective counterpart securing element 13 b on the transport carriage side, that is, arranged or designed on the transport carriage 5, such that the position of the first frame structure section 6 a that is moved into the transfer position is secured relative to the housing structure 3 on the work station side, and thus the first frame structure section 6 a (without actuation of the lifting device 7) cannot be moved out of the transfer position.

Respective securing elements 13a on the work station side and respective counterpart securing elements 13b on the transport carriage side interlockingly interact in the transfer position. Respective securing elements 13a on the work station side are designed as form fitting elements, that is, particularly as conical or cone-like or cone-shaped protrusions. Respective counterpart securing elements 13b on the transport carriage side are designed as corresponding counterpart form fitting elements, that is, particularly as conical or cone-like or cone-shaped receptacles or bushings. A corresponding form-fitting element, particularly in the form of a conical or cone-like or cone-shaped protrusion can, due to the geometric design thereof, perform a centering function, approximately like a centering bolt, for example. A centering of the first frame structure section 6a or of the entire transport carriage 5 relative to a housing structure 3 on the work station side, and thus a securing of the position of the first frame structure section 6a or the entire transport carriage can be implemented by the interaction of a form-fitting element and a respective counterpart form-fitting element in at least two, particularly three spatial axes or spatial directions that are oriented orthogonally to each other; see the registered coordinate system.

It was mentioned multiple times that a transfer of a powder module 4 from the transport carriage 5 into the work station 2, or the reverse, is possible in the transfer position. The frame structure 6 on the transport carriage side comprises at least one transfer interface for this purpose (not shown), particularly in the form of an opening, which enables a transfer of a powder module 4 from the receiving device 8 on the transport carriage side into a work station 2 or a transfer of a powder module 4 from the work station 2 into the receiving device 8 on the transport carriage side. Similarly, the housing structure 3 on the work station side comprises at least one transfer interface (not shown), particularly in the form of an opening, which enables a transfer of a powder module 4 from the work station 2 into the receiving device 8 on the transport carriage side or a transfer of a powder module 4 from a receiving device 8 on the transport carriage side into the work station 2. The transfer interface on the transport carriage side aligns in the transfer position with the transfer interface on the work station side such that a transfer of a powder module 4 from the transport carriage 5 into the work station 2, or the reverse, is enabled.

In order to enable a transfer of powder modules 4 between the transport carriages 5 associated with the system 1 and the work stations 2 associated with the system 1, within the system 1, which is simplified because it is standardized, the respective transfer interfaces on the work station side and the transport carriage side can be designed to be identical in terms of geometrical design for all of the work stations 2 and transport carriages 5 associated with the system 1, that is, standardized.

The respective transfer interfaces on the transport carriage side and on the work station side can be sealed via a closure device (not shown). A corresponding closure device can comprise a closure element that is borne so as to be movable between an open position, in which the respective transfer interface is enabled for transfer of a powder module 4, and a closed position, in which the respective transfer interface is not enabled for transfer of a powder module 4. A movement of the closure element into the open or into the closed position, or the reverse, can be automated, such as in dependence on the detection of the transfer position, that is, in dependence on the detection of a first frame structure section 6a that is moved into the transfer position. A detection of the transfer position or the detection of a first frame structure section 6a that is moved into the transfer position can occur via the second detection device 12 or via a third detection device (not shown). The third detection device can be designed analogously to the second detection device 12.

FIG. 1 shows that the receiving device 8 on the transport carriage side can comprise a bearing device 14 which is designed particularly for suspended bearing of at least one powder module 4 in the receptacle chamber 8a. The bearing device 14 is designed to movably bear a powder module 4, particularly between a first position that is completely accommodated in the receptacle chamber 8a or frame structure 6 (powder module bearing position) and a second position that partially protrudes out of the receptacle chamber 8a or the frame structure 6 (powder module transfer position). For this purpose, the bearing device 14 can comprise a plurality of bearing elements 14a, which enable a movable bearing of a powder module 4 accommodated in the receptacle chamber 8a. The bearing elements 14a can be sliding or roller bearing elements, which interact with a powder module 4, forming a movable bearing, that is, for example, by engaging in action sections (not shown) on the powder module side, formed by recesses on the powder module side, for example.

A corresponding bearing device 14 can comprise a powder module securing device (not shown). The powder module securing device is designed to secure the position of a powder module 4 accommodated in the receptacle chamber 8a. The powder module securing device can comprise at least one securing element on the frame structure side, which is designed to interact with a counterpart securing element on the powder module side, such that the positioning of the powder module 4 accommodated in the receptacle chamber 8a is secured. A corresponding securing element can be movable between a securing position, in which it is movable relative to a counterpart securing element on the powder module side, such that it interacts therewith, forming a securing of the position of a powder module 4, and a non-securing position, in which it is moved relative to a counterpart securing element on the powder module side, such that it does not interact therewith, forming a securing of the position of a powder module 4.

A securing element on the frame structure side can interact with a respective counterpart securing element on the powder module side in the transport position of the first frame structure section 6a. The transport position thus corresponds to a securing position in which the position of a powder module 4 is secured in respect of undesired position changes. This can be implemented in that the counterpart securing element on the powder module side in the transport position is movable relative to the securing element on the frame structure side such that they interact, forming a securing of the powder module 4 accommodated in the receptacle chamber 8*a*.

A securing element on the frame structure side and the counterpart securing element on the powder module side can interlockingly interact. The securing element can be designed as a form fitting element, that is, for example, particularly designed as a bolt-like or bolt-shaped protrusion and the counterpart securing element can be designed as a counterpart closure element, that is, for example, particularly a bushing-like or bushing-shaped receptacle for the protrusion.

In a manner analogous to that of the receptacle device 8 on the transport carriage side, respective work stations 2 can also comprise a corresponding bearing device 15. The bearing device 15 can be designed to bear a powder module 4 along a transport track, indicated by the double arrow P2, extending through the work station 2, movably relative to the housing structure 3, for which purpose the bearing device 15 comprises bearing elements 15*a* that enable a movable bearing of a powder module 4 arranged in the bearing device 15 relative to the housing structure 3 on the work station side. The corresponding bearing elements 15*a* can, in turn, be sliding or roller bearing elements, for example, which interact with a powder module 4, forming a movable bearing, that is, for example, by engaging in action sections on the powder module side, formed by recesses on the powder module side, for example.

The respective bearing devices on the transport carriage side and the respective bearing devices on the work station side 14, 15 expediently align in the transfer position of a first frame structure section 6*a* so that a continuous transport track extending between the transport carriage 5 and the work station 2 results, which enables powder modules 4 borne in respective bearing devices 14, 15 to be easily transferred from a transport carriage 5 into a work station 2 and the reverse. Respective bearing devices on the transport carriage side 14 and respective bearing devices on the work station side 15 are expediently designed to be identical or standardized for the same purpose.

The invention claimed is:

1. A work station configured to perform at least one work process using a powder module supplied to the work station by a transport carriage, the work station comprising:
   a housing structure;
   a first securing device configured to secure a transport carriage to the housing structure upon the transport carriage having been moved into a pre-docking position, the transport carriage comprising a frame structure and a lifting device configured to lift at least a first frame structure section of the frame structure, the first frame structure section comprising a receiving device having a receptacle chamber configured to receive a powder module;
   a first detection device configured to detect the transport carriage having been moved into the pre-docking position and secured by the first securing device;
   a second detection device configured to detect the first frame structure section having been lifted into a pre-transfer position, the lifting device lifting the first frame structure section when the first detection device detects the transport carriage having been moved into the pre-docking position and/or secured by the first securing device; and
   a second securing device configured to secure the transport carriage in a transfer position with the first frame structure section having been lifted by the lifting device;
   wherein the first securing device is configured to move the frame structure laterally from the pre-transfer position to the transfer position, thereby allowing the second securing device to secure the transport carriage in the transfer position, the powder module being transferrable from the transport carriage into the work station with the transport carriage being in the transfer position;
   wherein the at least one work process comprises: additive production of three dimensional objects, a preparatory work process that precedes the additive production of three dimensional objects, and/or a subsequent work process that follows the additive production of three-dimensional objects.

2. The work station of claim 1, comprising:
   a transport track configured to receive the powder module, the powder module being movable along the transport track into the housing structure.

3. The work station of claim 1, wherein the housing structure comprises a first bearing device configured to interact with a second bearing device that defines part of the receiving device of the transport carriage, the first bearing device and the second bearing device together providing a transport track extending between the transport carriage and the housing structure.

4. The work station of claim 3, wherein the second bearing device is configured to movably bear the powder module from a first position comprising the powder module being accommodated in the receptacle chamber to a second position comprising the powder module protruding from the receptacle chamber and/or from the first frame structure section.

5. The work station of claim 1, wherein the first securing device comprises a setting element (10*a*) movably coupled to a securing element.

6. The work station of claim 1, wherein the first detection device comprises an acoustic detection element, an electric detection element, an optical detection element, or a haptic detection element; and/or
   wherein the second detection device comprises an acoustic detection element, an electric detection element, an optical detection element, or a haptic detection element.

7. The work station of claim 1, wherein the second securing device comprises a first securing element configured to interlock with a second securing element of the transport carriage.

8. The work station of claim 7, wherein the first securing element and the second securing element respectively comprise form-fitting elements configured to align the first frame structure section relative to the housing structure.

9. The work station of claim 1, wherein the pre-docking position comprises the transport carriage being located at a distance from the housing structure of from 5 cm to 15 cm.

10. The work station of claim 1, wherein the first detection device is configured to generate pre-docking position information describing a location of the transport carriage relative to the pre-docking position; and/or wherein the first detection device is configured to generate securing information describing a securing of the transport carriage by the first securing device.

11. The work station of claim 10, wherein the lifting device is configured to lift at least the first frame structure section on the basis of the pre-docking position information and/or on the basis of the securing information.

12. The work station of claim 1, wherein the second detection device is configured generate pre-transfer position information describing a location of the first frame structure section relative to the pre-transfer position.

13. The work station of claim 12, wherein the first securing device is configured to move the frame structure laterally from the pre-transfer position to the transfer position on the basis of the pre-transfer position information.

14. The work station of claim 1, wherein the docking position comprises the transport carriage being located at a distance from the housing structure that is less than the distance corresponding to the pre-docking position.

15. The work station of claim 1, wherein the transfer position is realized with the first frame structure section having been lifted into the pre-transfer position and the transport carriage having been moved to the docking position.

16. The work station of claim 1, wherein the powder module comprises:
    a construction module comprising a process chamber in which additive construction of a three-dimensional object occurs;
    a dosing module from which construction material is dosed into the process chamber during the additive construction of the three-dimensional object; or
    an overflow module configured to receive excess non-solidified construction material.

17. A method of supplying a powder module to a work station configured to perform at least one work process, the method comprising:
    securing with a first securing device, a transport carriage to a housing structure of a work station upon the transport carriage having been moved into a pre-docking position, the transport carriage comprising a frame structure and a lifting device configured to lift at least a first frame structure section of the frame structure, the first frame structure section comprising a receiving device having a receptacle chamber configured to receive a powder module;
    detecting with a first detection device, the transport carriage having been moved into the pre-docking position and secured by the first securing device;
    detecting with a second detection device, the first frame structure section having been lifted into a pre-transfer position, the lifting device lifting the first frame structure section when the first detection device detects the transport carriage having been moved into the pre-docking position and/or secured by the first securing device;
    moving with the first securing device, the frame structure laterally from the pre-transfer position to a transfer position; and
    securing with a second securing device, the transport carriage in the transfer position with the first frame structure section having been lifted by the lifting device, the powder module being transferrable from the transport carriage into the work station with the transport carriage being in the transfer position;
    wherein the at least one work process comprises: additive production of three dimensional objects, a preparatory work process that precedes the additive production of three dimensional objects, and/or a subsequent work process that follows the additive production of three-dimensional objects.

18. The method of claim 17, comprising:
    transferring the powder module along a transport track extending between the transport carriage and the housing structure, wherein the housing structure comprises a first bearing device and the transport carriage comprising a second bearing device, the first bearing device and the second bearing device together defining at least a portion of the transport track.

* * * * *